United States Patent
Aziz et al.

(10) Patent No.: US 7,811,679 B2
(45) Date of Patent: *Oct. 12, 2010

(54) DISPLAY DEVICES WITH LIGHT ABSORBING METAL NANOPARTICLE LAYERS

(75) Inventors: Hany Aziz, Oakville (CA); Anthony J. Paine, Mississauga (CA); Zoran D. Popovic, Mississauga (CA)

(73) Assignee: LG Display Co., Ltd., Seoul (KR)

( * ) Notice: Subject to any disclaimer, the term of this patent is extended or adjusted under 35 U.S.C. 154(b) by 583 days.

This patent is subject to a terminal disclaimer.

(21) Appl. No.: 11/133,753

(22) Filed: May 20, 2005

(65) Prior Publication Data

US 2006/0263593 A1    Nov. 23, 2006

(51) Int. Cl.
*H01L 51/52* (2006.01)
*H05B 33/02* (2006.01)

(52) U.S. Cl. .................. 428/690; 428/917; 313/506; 257/98; 257/102; 257/103

(58) Field of Classification Search ............ 428/690, 428/917; 427/58, 66; 313/502–509; 257/40, 257/88–103, E51.001–E51.052; 252/301.16–301.35
See application file for complete search history.

(56) References Cited

U.S. PATENT DOCUMENTS

| | | | |
|---|---|---|---|
| 2,823,905 | A | 2/1958 | Brown |
| 3,172,862 | A | 3/1965 | Gurnee et al. |
| 3,598,644 | A | 8/1971 | Goffe et al. |
| 4,084,966 | A | 4/1978 | Haas et al. |
| 4,287,449 | A | 9/1981 | Takeda et al. |
| 4,356,429 | A | 10/1982 | Tang |
| 4,539,507 | A | 9/1985 | VanSlyke et al. |
| 4,652,794 | A | 3/1987 | Waite et al. |
| 4,665,115 | A | 5/1987 | Lundberg et al. |
| 4,720,432 | A | 1/1988 | VanSlyke et al. |

(Continued)

FOREIGN PATENT DOCUMENTS

EP    0 831 676    3/1998

(Continued)

OTHER PUBLICATIONS

Grandin et al., "Light-Absorption Phenomena in Novel Low-Reflectance Cathodes for Organic Light-Emitting Devices Utilizing Metal-Organic Mixtures," Advanced Materials, vol. 15, No. 23, pp. 2021-2024, Dec. 2003.*

(Continued)

*Primary Examiner*—Ula C Ruddock
*Assistant Examiner*—Camie S Thompson
(74) *Attorney, Agent, or Firm*—McKenna Long & Aldridge LLP (57) ABSTRACT

A display device comprising a light-absorbing layer comprising metal nanoparticles in a matrix material. Suitable matrix materials include organic materials, inorganic materials, polymeric materials, and combinations thereof. The metal nanoparticles may have various regular or irregular shapes and/or two-dimensional or three-dimensional structures. The metal nanoparticles may have a particle size of from about 2 to about 20 nm. In embodiments, the particle size distribution of the nanoparticles does not exceed +/−75%. The light-absorbing layer may have a multiple layer configuration comprising 2 or more individual light-absorbing layers. The light-absorbing layer(s) reduces the reflection of ambient light in a display device.

32 Claims, 4 Drawing Sheets

U.S. PATENT DOCUMENTS

| | | | |
|---|---|---|---|
| 4,769,292 A | 9/1988 | Tang et al. |
| 4,885,211 A | 12/1989 | Tang et al. |
| 5,049,780 A | 9/1991 | Dobrowolski et al. |
| 5,059,861 A | 10/1991 | Littman et al. |
| 5,141,671 A | 8/1992 | Bryan et al. |
| 5,150,006 A | 9/1992 | Van Slyke et al. |
| 5,151,629 A | 9/1992 | VanSlyke |
| 5,227,252 A | 7/1993 | Murayama et al. |
| 5,247,190 A | 9/1993 | Friend et al. |
| 5,276,381 A | 1/1994 | Wakimoto et al. |
| 5,409,783 A | 4/1995 | Tang et al. |
| 5,429,884 A | 7/1995 | Namiki et al. |
| 5,457,565 A | 10/1995 | Namiki et al. |
| 5,516,577 A | 5/1996 | Matsuura et al. |
| 5,593,788 A | 1/1997 | Shi et al. |
| 5,601,903 A | 2/1997 | Fujii et al. |
| 5,608,287 A | 3/1997 | Hung et al. |
| 5,703,436 A | 12/1997 | Forrest et al. |
| 5,707,745 A | 1/1998 | Forrest et al. |
| 5,719,467 A | 2/1998 | Antoniadis et al. |
| 5,728,801 A | 3/1998 | Wu et al. |
| 5,739,635 A | 4/1998 | Wakimoto |
| 5,776,622 A | 7/1998 | Hung et al. |
| 5,837,391 A | 11/1998 | Utsugi |
| 5,846,666 A | 12/1998 | Hu et al. |
| 5,853,905 A | 12/1998 | So et al. |
| 5,925,472 A | 7/1999 | Hu et al. |
| 5,925,980 A | 7/1999 | So et al. |
| 5,935,720 A | 8/1999 | Chen et al. |
| 5,935,721 A | 8/1999 | Shi et al. |
| 5,942,340 A | 8/1999 | Hu et al. |
| 5,952,115 A | 9/1999 | Hu et al. |
| 5,955,836 A | 9/1999 | Boerner et al. |
| 5,972,247 A | 10/1999 | Shi et al. |
| 6,013,384 A | 1/2000 | Kido et al. |
| 6,023,073 A | 2/2000 | Strite |
| 6,028,327 A | 2/2000 | Mizoguchi et al. |
| 6,057,048 A | 5/2000 | Hu et al. |
| 6,105,202 A | 8/2000 | Grasso et al. |
| 6,107,734 A | 8/2000 | Tanaka et al. |
| 6,130,001 A | 10/2000 | Shi et al. |
| 6,225,467 B1 | 5/2001 | Esteghamatian et al. |
| 6,229,012 B1 | 5/2001 | Hu et al. |
| 6,274,980 B1 | 8/2001 | Burrows et al. |
| 6,303,250 B1 | 10/2001 | Watanabe et al. |
| 6,392,250 B1 | 5/2002 | Aziz et al. |
| 6,392,339 B1 | 5/2002 | Aziz et al. |
| 6,423,429 B2 | 7/2002 | Kido et al. |
| 6,437,123 B1 | 8/2002 | Bock et al. |
| 6,465,115 B2 | 10/2002 | Shi et al. |
| 6,479,172 B2 | 11/2002 | Hu et al. |
| 6,562,485 B2 | 5/2003 | Hu et al. |
| 6,565,996 B2 | 5/2003 | Hatwar et al. |
| 6,614,175 B2 | 9/2003 | Aziz et al. |
| 6,717,358 B1 | 4/2004 | Liao et al. |
| 6,734,625 B2 | 5/2004 | Vong et al. |
| 6,737,177 B2 | 5/2004 | Aziz et al. |
| 6,740,429 B2 | 5/2004 | Aziz et al. |
| 6,750,609 B2 | 6/2004 | Aziz et al. |
| 6,753,098 B2 | 6/2004 | Aziz et al. |
| 6,759,146 B2 | 7/2004 | Aziz et al. |
| 6,765,348 B2 | 7/2004 | Aziz et al. |
| 6,773,830 B2 | 8/2004 | Aziz et al. |
| 6,821,643 B1 | 11/2004 | Hu et al. |
| 6,841,932 B2 | 1/2005 | Aziz et al. |
| 7,083,490 B2 * | 8/2006 | Mueller et al. .................. 445/24 |
| 7,211,948 B2 | 5/2007 | Liao et al |
| 7,288,887 B2 | 10/2007 | Aziz et al. |
| 7,291,404 B2 | 11/2007 | Aziz et al. |
| 7,351,999 B2 | 4/2008 | Li |
| 2002/0037398 A1 | 3/2002 | Tofuku et al. |
| 2002/0121860 A1 | 9/2002 | Seo et al. |
| 2002/0135296 A1 | 9/2002 | Aziz et al. |
| 2002/0145380 A1 | 10/2002 | Aziz et al. |
| 2002/0180349 A1 | 12/2002 | Aziz et al. |
| 2003/0071565 A1 | 4/2003 | Hatwar et al. |
| 2003/0116772 A1 | 6/2003 | Yamazaki et al. |
| 2003/0134146 A1 | 7/2003 | Aziz et al. |
| 2003/0189401 A1 | 10/2003 | Kido et al. |
| 2003/0230974 A1 | 12/2003 | Chang et al. |
| 2003/0234609 A1 | 12/2003 | Aziz et al. |
| 2004/0004433 A1 | 1/2004 | Lamansky et al. |
| 2004/0009418 A1 | 1/2004 | Main et al. |
| 2004/0018383 A1 | 1/2004 | Aziz et al. |
| 2004/0027059 A1 | 2/2004 | Tsutsui |
| 2004/0209184 A1 | 10/2004 | Hatakeyama et al. |
| 2004/0227460 A1 | 11/2004 | Liao et al. |
| 2004/0262615 A1 | 12/2004 | Cok |
| 2005/0064235 A1 | 3/2005 | Liao et al. |
| 2005/0100760 A1 | 5/2005 | Yokoyama |
| 2005/0112400 A1 | 5/2005 | Seo et al. |
| 2005/0140275 A1 | 6/2005 | Park |
| 2005/0175857 A1 | 8/2005 | Coggan et al. |
| 2006/0105202 A1 | 5/2006 | Kitamura |
| 2006/0139516 A1 | 6/2006 | Park |
| 2006/0139893 A1 | 6/2006 | Aziz et al. |
| 2006/0194076 A1 | 8/2006 | Nariyuki |
| 2006/0251919 A1 | 11/2006 | Aziz et al. |
| 2006/0251920 A1 | 11/2006 | Aziz et al. |
| 2006/0261727 A1 * | 11/2006 | Aziz et al. .................. 313/503 |
| 2006/0261731 A1 | 11/2006 | Aziz et al. |
| 2006/0263593 A1 | 11/2006 | Aziz et al. |
| 2006/0263628 A1 | 11/2006 | Aziz et al. |
| 2006/0263629 A1 | 11/2006 | Aziz et al. |

FOREIGN PATENT DOCUMENTS

| | | |
|---|---|---|
| EP | 0 977 287 | 2/2000 |
| EP | 0 977 288 | 2/2000 |
| EP | 1 009 044 A2 | 6/2000 |
| EP | 1 017 118 | 7/2000 |
| EP | 1029832 A | 8/2000 |
| EP | 1 160 890 | 12/2001 |
| EP | 1 167 488 | 1/2002 |
| EP | 1 311 139 A1 | 5/2003 |
| EP | 1 339 112 A2 | 8/2003 |
| EP | 1 408 563 | 4/2004 |
| EP | 1 624 503 A2 | 2/2006 |
| EP | 1 624 504 A2 | 2/2006 |
| EP | 1 010 359 B1 | 4/2006 |
| JP | 04-230997 | 8/1992 |
| JP | 06-176870 | 6/1994 |
| JP | 8-222374 A | 8/1996 |
| JP | 09-188875 | 7/1997 |
| JP | 10-316904 | 12/1998 |
| JP | 11-312584 | 11/1999 |
| JP | 11-329749 | 11/1999 |
| JP | 2002-055203 | 2/2002 |
| JP | 2003-045676 | 2/2003 |
| JP | 2003-086381 | 3/2003 |
| JP | 2003-151777 | 5/2003 |
| JP | 2004-039617 | 2/2004 |
| JP | 2004-095546 | 3/2004 |
| JP | 2004-139981 | 5/2004 |
| JP | 2004-317897 | 11/2004 |
| JP | 2005-070574 | 3/2005 |
| JP | 2005-072012 | 3/2005 |
| JP | 2006-173550 | 6/2006 |
| JP | 2006-210845 | 8/2006 |
| WO | WO 97/33296 A1 | 9/1997 |
| WO | WO 98/41065 A1 | 9/1998 |
| WO | WO 00/30139 | 5/2000 |
| WO | WO 01/06816 | 2/2001 |
| WO | WO 01/08240 | 2/2001 |

| WO | WO 03/055275 | 7/2003 |
| WO | WO 03/088718 A1 | 10/2003 |
| WO | WO/2004/068911 | 8/2004 |
| WO | WO 2005/037954 | 4/2005 |
| WO | WO 2006/033472 | 3/2006 |
| WO | WO 2006/038573 A1 | 4/2006 |
| WO | WO 2006/076092 A1 | 7/2006 |

OTHER PUBLICATIONS

Endo et al., "Organic Electroluminescent Devices with a Vacuum-Deposited Lewis-Acid-Doped Hole-Injecting Layer", Japanese Journal of Applied Physics, vol. 41, pp. L358-L360 (Mar. 2002).

Day et al., "The use of charge transfer interlayers to control hole injection in molecular organic light emitting diodes", Thin Solid Films, vol. 410, pp. 159-166 (Mar. 2002).

Hyun-Ouk Ha et al., "Improving the efficiency of organic electroluminescent devices by introducing an electron-accepting and thermally stable polymer", Optical Materials, vol. 21, pp. 165-168 (2002).

Liu et al., "Development of highly stable organic electroluminescent devices with a doped co-host emitter system", Current Applied Physics 5, pp. 218-221 (2005).

Aziz et al., "Reduced reflectance cathode for organic light-emitting devices using metalorganic mixtures", Applied Physics Letters, vol. 83, No. 1, pp. 186-188 (2003).

Welying Gao; Controlled p doping of the hole-transport molecular material N,N'=diphenyl-N,N'-bis(1-naphthyl)-1,1'-biphenyl-4,4'-diamine with Terafluorotetracyanoquinodimethane, Journal of Applied Physics, vol. 94, No. 1 (Jul. 1, 2003), pp. 359-366.

H. Michelle Grandia et al.; Light-Absorption Phenomena in Novel Low-Reflective Cathodes for Organic Light-Emitting Devices Utilizing Metal-Organic Mixtures; Advanced Materials, 2003, 15, No. 23; pp. 2021-2024.

Choong et al.; "Organic Light Emitting Diodes With a Bipolar Transport Layer"; Applied Physics Letters; vol. 75, No. 2, Jul. 12, 1999, pp. 172-174.

Matsumoto, Toshio et al., Multiphoton Emission OLED: Structure and Property, IDW'03; Dec. 2003, pp. 1285-1288.

A. Gyoutoku et al., "An Organic Electroluminescent Dot-Matrix Display Using Carbon Underlayer", Synthetic Metals, vol. 91, pp. 73-75 (1997).

Baldo et al., "Highly efficient phosphorescent emission from organic electroluminescent devices," Letters to Nature, vol. 395, pp. 151-154 (1998).

Bernius et al., "Developmental Progress of Electroluminescent Polymeric Materials and Devices" Proceedings of SPIE Conference on Organic Light Emitting Materials and Devices III, Denver, Colo., vol. 3797, p. 129-137 (Jul. 1999).

Carter et al., "Polymeric anodes for improved polymer light-emitting diode performance", Appl. Phys. Lett. 70 (16), pp. 2067-2069 (Apr. 21, 1997).

Chengfeng Qiu et al., Comparative Study of Metal or Oxide Capped Indium-Tin Oxide Anodes for Organic Light-Emitting Diodes, Journal of Applied Physics, vol. 93, No. 6 pp. 3253-3257 (Mar. 15, 2003).

Chengfeng Qiu et al., "Praseodymium Oxide Coated Anode for Organic Light-Emitting Diode", Applied Physics Letters, vol. 80, No. 19, pp. 3485-3487 (May 13, 2002).

Chieh-Wei Chen et al., "Top-Emitting Organic Light-Emitting Devices Using Surface-Modified Ag Anode," Applied Physics Letters, vol. 83, No. 25, pp. 5127-5129 (Dec. 22, 2003).

Hongjin Jiang et al., "Improvement of Organic Light-Emitting Diodes Performance by the Insertion of a $Si_3N_4$ Layer", Thin Solid Films, vol. 363, pp. 25-28 (2000).

I-Min Chan et al., "Enhanced Hole Injections in Organic Light-Emitting Devices by Depositing Nickel Oxide on Indium Tin Oxide Anode," Applied Physics Letters, vol. 81, No. 10, pp. 1899-1901 (Sep. 2, 2002).

Kedo et al., "White-Light-Emitting Organic Electroluminescent Device Using Lanthanide Complexes," Jpn. J. Appl. Phys., vol. 35, pp. L394-L396 (1996).

Kim et al., "Anode material based on Zr-doped ZnO thin films for organic light-emitting diodes", Appl. Phys. Lett., vol. 83, No. 18, pp. 3809-3811 (Nov. 3, 2003).

Kim et al., "Molecular organic light-emitting diodes using highly conducting polymers as anodes", Appl. Phys. Lett., vol. 80 No. 20, pp. 3844-3846 (May 20, 2002).

L.S. Hung et al., "Anode Modification of in Organic Light-Emitting Diodes by Low-Frequency Plasma Polymerization of CHF3", Applied Physics Letters, vol. 78, No. 5, pp. 673-675 (Jan. 29, 2001).

S. A. VanSlyke et al., "Organic Electroluminescent Devices with Improved Stability", Applied Physics Letters, vol. 69, No. 15, pp. 2160-2162 (Oct. 7, 1996).

S. Karg et al., "Increased Brightness and Lifetime of Polymer Light Emitting Diodes with Polyanilne Anodes", Synthetic Metals, vol. 80, pp. 111-117 (1996).

Soo-Jin Chua et al., "Stabilization of Electrode Migration in Polymer Electroluminescent Devices", Applied Physics Letters, vol. 81, No. 6, pp. 1119-1121 (Aug. 5, 2002).

Wenping Hu et al., "Lowering of Operational Voltage of Organic Electroluminescent Devices by Coating Indium Tin Oxide Electrodes with a Thin $CuO_x$ Layer", Applied Physics Letters, vol. 80, No. 15, pp. 2640-2641 (Apr. 15, 2002).

Yulong Shen et al., "Modification of Indium Tin Oxide for Improved Hole Injection in Organic Light Emitting Diodes," Advanced Materials, vol. 13, No. 16 pp. 1234-1238 (Aug. 16, 2001).

Z.B. Deng et al., "Enhanced Brightness and Efficiency in Organic Electroluminescent Devices Using $SiO_2$ Buffer Layers", Applied Physics Letters, vol. 74, No. 15, pp. 2227-2229 (Apr. 12, 1999).

Zugang et al., "Organic thin film electroluminescent devices with ZnO:Al as the anode", J. Phys.: Condens. Matter 8, pp. 3221-3228 (1996).

Blochwitz et al., "Non-polymeric OLEDs with a doped amorphous hole transport layer and operating voltages down to 3.2 V to achieve 100 $cd/m^2$", Synth. Metals 2002, vol. 127, pp. 169-173.

* cited by examiner

DISPLAY DEVICES WITH LIGHT ABSORBING METAL NANOPARTICLE LAYERS

BACKGROUND

The present disclosure relates, in various exemplary embodiments, to display devices comprising light-absorbing layers. The light-absorbing layers comprise metal nanoparticles in a matrix material. While the light-absorbing layers are described with particular reference to organic light emitting devices (OLEDs), it will be appreciated that the light-absorbing layers comprising the metal nanoparticles are amenable to other similar applications and display devices.

Organic light emitting devices (OLEDs) represent a promising technology for display applications. A typical organic light emitting device includes a first electrode; a luminescent region comprising one or more electroluminescent organic material(s); and a second electrode; wherein one of the first electrode and the second electrode functions as a hole-injecting anode, and the other electrode functions as an electron-injecting cathode; and wherein one of the first electrode and the second electrode is a front electrode, and the other electrode is a back electrode. The front electrode is transparent (or at least partially transparent) while the back electrode is usually highly reflective to light. When a voltage is applied across the first and second electrodes, light is emitted from the luminescent region and through the transparent front electrode. When viewed under high ambient illumination, the reflective back electrode reflects a substantial amount of the ambient illumination to the observer, which results in higher ratios of reflected illumination as compared to the device's own emission resulting in "washout" of the displayed image.

In order to improve the contrast of electroluminescent displays in general, light-absorbing layers as described, for example, in U.S. Pat. No. 4,287,449, or optical interference members as described, for example, in U.S. Pat. No. 5,049,780, have been used to reduce the ambient illumination reflection.

Another problem of known organic light emitting devices originates from the use of metals with low work functions, and hence high reactivity, in the cathodes. Due to their high reactivity, such cathode materials are unstable in ambient conditions and react with atmospheric $O_2$ and water to form non-emissive dark spots. See, for example, Burrows et al., "Reliability and Degradation of Organic Light Emitting Devices," Appl. Phys. Lett. Vol. 65, pp. 2922-2924 (1994). To reduce such ambient effects, organic light emitting devices are typically hermetically sealed, immediately after fabrication, under stringent conditions, such as, for example, less than 10 ppm moisture atmospheres.

Other recent developments in reducing the reflection of ambient light in display devices have been directed to metal-organic mixed layers such as described in, for example, U.S. patent application Ser. No. 10/117,812, which is published as U.S. Patent Publication No. 2002/0180349, now U.S. Pat. No. 6,841,932, and U.S. patent application Ser. No. 10/401,238, which is published as U.S. Patent Publication No. 2003/0234609. Other methods to reduce light reflection are addressed in U.S. Pat. No. 6,750,609. These applications and patents are incorporated herein by reference in their entirety.

Other documents that may be relevant to the present application include the following: U.S. Pat. No. 4,652,794; U.S. Pat. No. 6,023,073; Liang-Sun Hung, et al., "Reduction of Ambient Light Reflection in Organic Light-Emitting Diodes," Advanced Materials Vol. 13, pp. 1787-1790 (2001); Liang-Sun Hung, et al., U.S. patent application Ser. No. 09/577,092 (filed May 24, 2000); EP 1 160 890 A2 (claims priority based on above U.S. patent application Ser. No. 09/577,092; Japanese laid open patent document No. 8-222374 (laid open date Aug. 30, 1996); O. Renault, et al., "A low reflectivity multilayer cathode for organic light-emitting diodes," Thin Solid Films, Vol. 379, pp. 195-198 (2000); WO 01/08240 A1; WO 01/06816 A1; David Johnson, et al., Technical Paper 33.3, "Contrast Enhancement of OLED Displays," http://www.luxell.com/pdfs/OLED tech ppr.pdf, pp. 1-3 (April 2001); Junji Kido, et al., "Bright organic electroluminescent devices having a metal-doped electron-injecting layer," Applied Physics Letters Vol. 73, pp. 2866-2868 (1998); Jae-Gyoung Lee, et al., "Mixing effect of chelate complex and metal in organic light-emitting diodes," Applied Physics Letters Vol. 72, pp. 1757-1759(1998); Jingsong Huang, et al., "Low-voltage organic electroluminescent devices using pin structures," Applied Physics Letters Vol. 80, pp. 139-141 (2002); L. S. Hung, et al., "Sputter deposition of cathodes in organic light emitting diodes," Applied Physics Letters, Vol. 86, pp. 4607-4612 (1999); EP 0 977 287 A2; EP 0 977 288 A2; Hany Aziz, et al., "Reduced reflectance cathode for organic light-emitting devices using metal organic mixtures," Applied Physics Letters Vol. 83, pp. 186-188 (2003); and, H. Michelle Grandin et al., "Light-Absorption Phenomena in Novel Low-Reflectance Cathodes for Organic Light-Emitting Devices Utilizing Metal-Organic Mixtures," Advanced Materials, Vol. 15, No. 23, 2021-2024 (2003).

The entire disclosures of the foregoing patents, applications, and articles are each incorporated herein by reference in their entirety.

Other documents that may be relevant to the present application were submitted in U.S. patent application Ser. No. 09/800,716 (filed Mar. 8, 2001), now abandoned, such other documents being: U.S. Pat. No. 4,885,211; U.S. Pat. No. 5,247,190; U.S. Pat. No. 4,539,507; U.S. Pat. No. 5,151,629; U.S. Pat. No. 5,150,006; U.S. Pat. No. 5,141,671; U.S. Pat. No. 5,846,666; U.S. Pat. No. 5,516,577; U.S. Pat. No. 6,057,048; U.S. Pat. No. 5,227,252; U.S. Pat. No. 5,276,381; U.S. Pat. No. 5,593,788; U.S. Pat. No. 3,172,862; U.S. Pat. No. 4,356,429; U.S. Pat. No. 5,601,903; U.S. Pat. No. 5,935,720; U.S. Pat. No. 5,728,801; U.S. Pat. No. 5,942,340; U.S. Pat. No. 5,952,115; U.S. Pat. No. 4,720,432; U.S. Pat. No. 4,769,292; U.S. Pat. No. 6,130,001; Bemius, et al., "Developmental progress of electroluminescent polymeric materials and devices," SPIE Conference on Organic Light Emitting Materials and Devices III, Denver, Colo., July 1999, SPIE, Vol. 3797, pp. 129-137; Baldo, et al., "Highly efficient organic phosphorescent emission from organic electroluminescent devices," Nature Vol. 395, pp. 151-154 (1998); and, Kido, et al., "White light emitting organic electroluminescent device using lanthanide complexes," Jpn. J. Appl. Phys. Vol. 35, pp. L394-L396 (1996).

All of the above patents, applications and articles are incorporated by reference in their entirety.

There is still a need to provide compositions suitable for use in a light-absorbing layer for display devices. Additionally, there is also a need to provide new configurations of light-absorbing layers suitable for use in a display device.

BRIEF DESCRIPTION

Aspects of the present disclosure, in embodiments thereof, include a display device comprising a cathode; an anode; a luminescent region disposed between the cathode and the anode; and a light-absorbing layer comprising i) metal nanoparticles, and ii) a matrix material selected from the group consisting of organic materials, inorganic materials, polymeric materials and combinations thereof, wherein the average particle size of the population of nanoparticles in the light absorbing layer is from about 1 to about 30 nm, including from about 2 to about 20 nm, and the nanoparticles have a particle size distribution not exceeding ±75%.

Another aspect of the present disclosure, in embodiments thereof, includes a display device comprising a first electrode; a second electrode; a luminescent region disposed between the first and second electrode; and a light-absorbing layer comprising: i) metal nanoparticles, and ii) a matrix material selected from the group of polymeric materials, inorganic materials, organic materials, and combinations thereof, wherein the metal nanoparticles have an average particle size of from about 5 to about 15 nm, including about 10 nm.

Still another aspect of the present disclosure, in embodiments thereof, includes an organic light emitting device comprising an anode; a cathode; and a luminescent region disposed between the anode and the cathode, wherein said cathode comprises a light-absorbing layer comprising i) metal nanoparticles, and ii) a matrix material selected from the group consisting of polymeric materials, inorganic materials, organic materials, and combinations thereof, wherein the population of the metal nanoparticles has a particle size distribution not exceeding ±50%, including ±25%.

These and other non-limiting aspects or embodiments of the present disclosure will be further described with reference to the drawings and descriptions set forth below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

The disclosure relates to display devices comprising a light-absorbing layer. A display device in accordance with the present disclosure generally comprises a first electrode, a second electrode, a luminescent region disposed between the first and second-electrode, and a light-absorbing layer (LAL). The light-absorbing layer comprises metal nanoparticles in a matrix material. The light-absorbing layer may be located or positioned anywhere in the display device. For example, the light-absorbing layer may be disposed between the first electrode and the luminescent region; between the second electrode and the luminescent region; as part of the first electrode; as part of the second electrode; as part of the luminescent region; or located outside of one of the first or second electrodes. A display device may comprise a plurality of light-absorbing layers. In a display device comprising a plurality of light-absorbing layers, the light-absorbing layers may be separated by one or more other layers suitable for a display device. Alternatively, a plurality of light-absorbing layers may be considered to form a light-absorbing region or zone wherein the plurality of light-absorbing layers are in contact with one another, i.e., in a stacked configuration, or the plurality of light-absorbing layers are separated by one or more of the layers.

For purposes of the present disclosure, the following definitions are applicable. Unless otherwise indicated, the term "layer" refers to a single coating having a composition that differs from the composition of an adjacent layer in terms of at least one of i) the concentration of the components and ii) the components that form the respective compositions. For example, adjacent layers will be considered separate if they are formed from compositions having the same components but at different concentrations. Please note that the term "light-absorbing layer" as used herein encompasses both a single light-absorbing layer or plurality of light-absorbing layers defining a particular light-absorbing region or zone. The term "region" refers to a single layer, a plurality of layers such as 2, 3, 4, 5 or more layers, and/or one or more "zones." The term "zone" as used herein, such as, for example, with respect to the charge transport zone (i.e., hole transport zone and electron transport zone), the light-emitting zone, and the light-absorbing zone, refers to a single layer, a plurality of layers, a single functional area, or a plurality of functional areas. "Light emitting region" and "luminescent region" are used interchangeably.

A more complete understanding of the processes and apparatuses disclosed herein can be obtained by reference to the accompanying drawings. These figures are merely schematic representations based on convenience and the ease of demonstrating the present development, and are, therefore, not intended to indicate relative size and dimensions of the display devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

Figure 1:
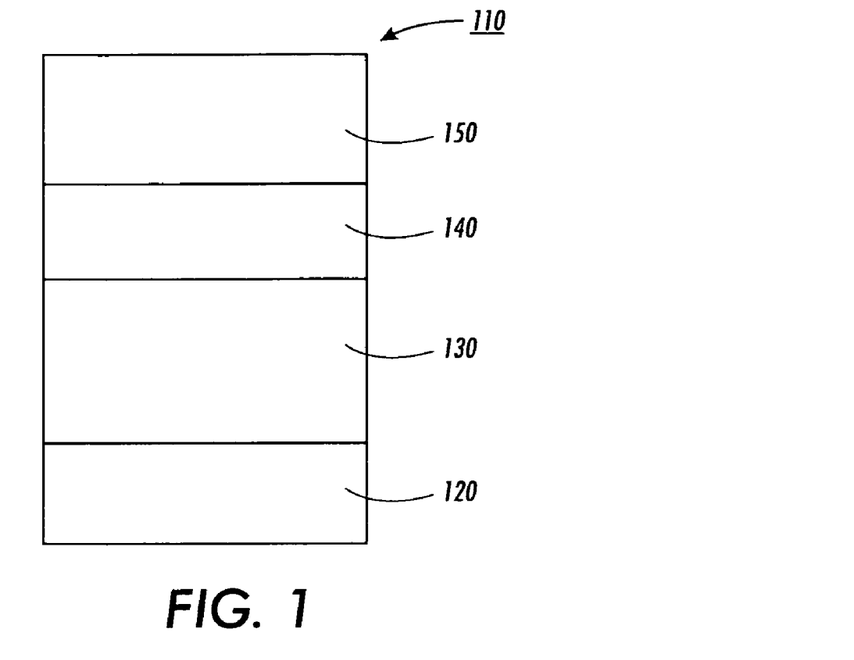
FIG. 1 is a schematic cross-sectional view of a display device comprising a light-absorbing layer disposed between a cathode and a luminescent region.

FIGS. 1-7 depict several exemplary embodiments of display devices comprising a light-absorbing layer in accordance with the disclosure. With reference to FIG. 1, an organic light emitting device 110 comprises an anode 120, a luminescent region 130, a cathode 150, and a light-absorbing layer 140 disposed between the cathode 150 and the luminescent region 130.

Figure 2:
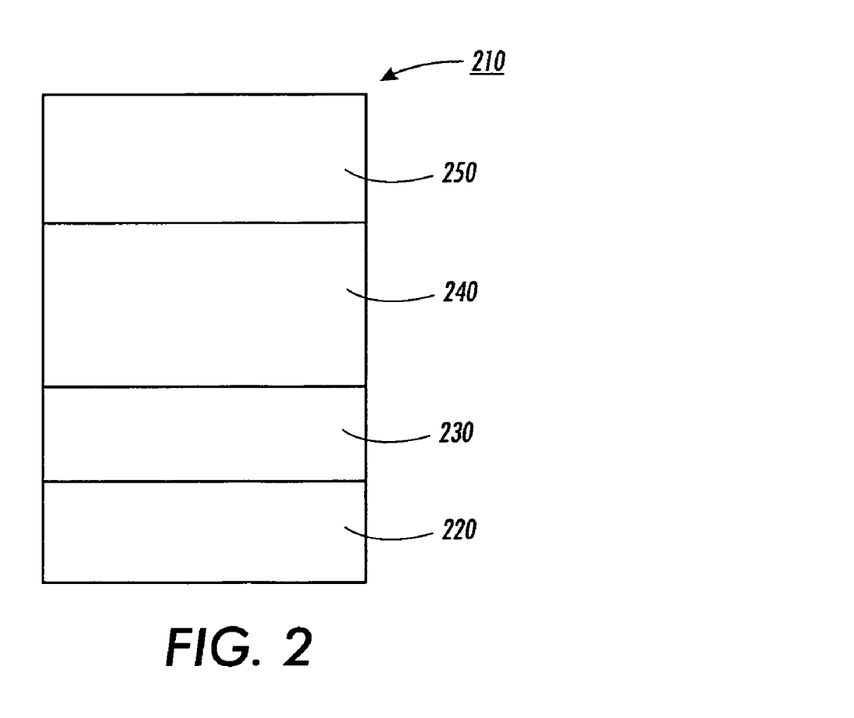
FIG. 2 is a schematic cross-sectional view of a display device comprising a light-absorbing layer disposed between an anode and a luminescent region.

With reference to FIG. 2, an organic light emitting device 210 comprises an anode 220, a luminescent region 240, a cathode 250, and a light-absorbing layer 230 disposed between the anode 220 and the luminescent region 240.

Figure 3:
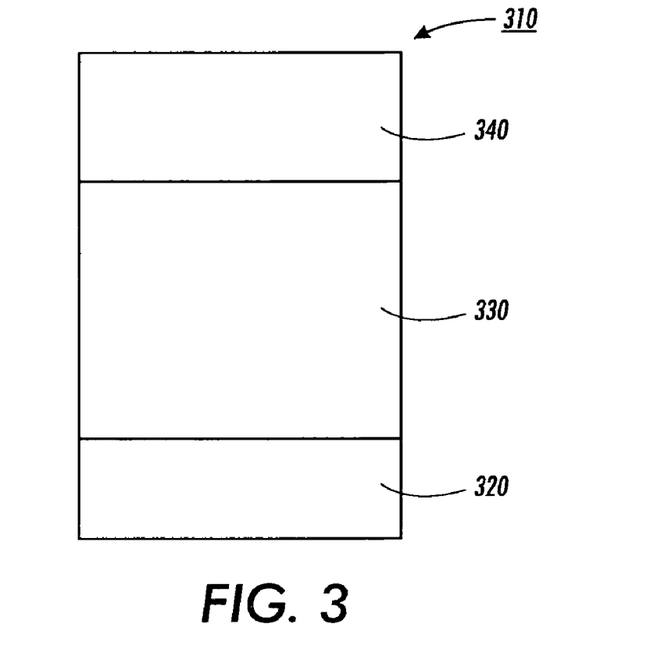
FIG. 3 is a schematic cross-sectional view of a display device in which one of a first or second electrode comprises a light-absorbing layer.

With reference to FIG. 3, an organic light emitting device 310 comprises a first electrode 320, a luminescent region 330, and a second electrode 340. The first and second electrodes may be one of an anode or a cathode. Additionally, one of the first or second electrodes comprises a light-absorbing layer in accordance with the present disclosure.

Figure 4:
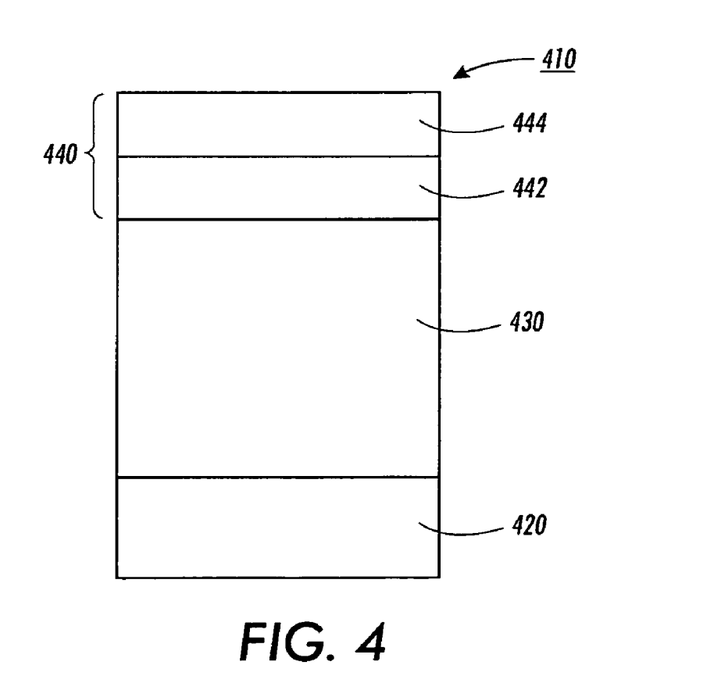
FIG. 4 is a schematic cross-sectional view of a display device having a cathode comprising a light-absorbing layer.

With reference to FIG. 4, an organic light emitting device 410 comprises an anode 420, a luminescent region 430, and a cathode 440. Cathode 440 comprises a light-absorbing layer 442 and an additional layer 444. It will be appreciated, that a display device such as the device shown in FIG. 4 may comprise one or more additional layers such as layer 444. An additional layer, such as layer 444, may be, for example, a capping layer or region. In embodiments of a cathode comprising one or more such additional layers, the light-absorbing layer acts as an electron injection contact. The light-absorbing layer is formed to contact the luminescent region 430.

Figure 5:
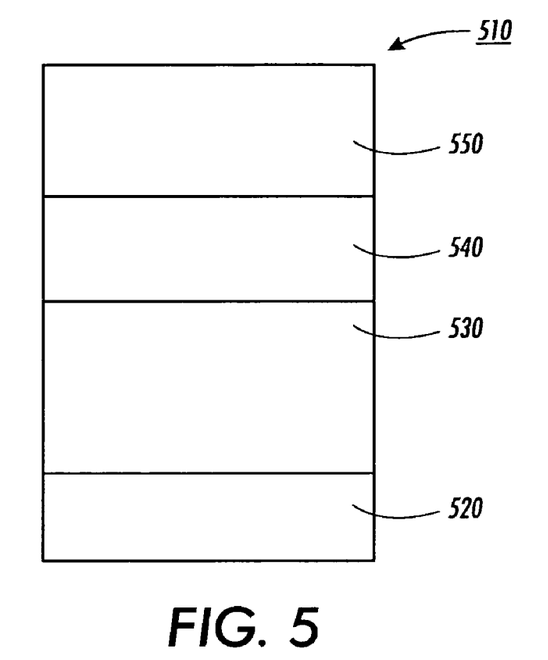
FIG. 5 is a schematic cross-sectional view of a display device comprising a light-absorbing layer located outside of the electrodes.

With reference to FIG. 5, a display device is shown wherein a light-absorbing layer is located or positioned outside of the electrodes. In FIG. 5, organic light emitting device 510 comprises a first electrode 520, a luminescent region 530, a second electrode 540, and a light-absorbing layer 550 located outside the second electrode 540. The second electrode may be one of a cathode or an anode.

Figure 6:
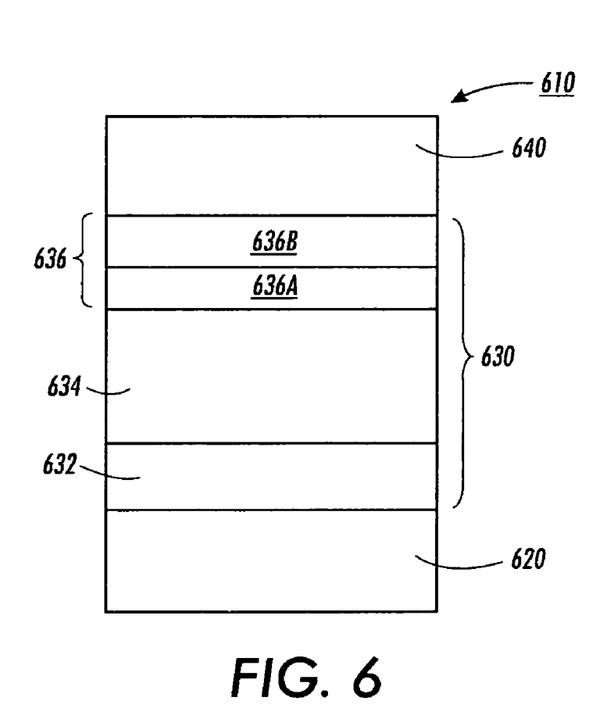
FIG. 6 is a schematic cross-sectional view of a display device wherein a light-absorbing layer is part of the luminescent region.

With reference to FIG. 6, a light-absorbing layer is depicted as being part of the luminescent region. In FIG. 6, organic light emitting device 610 comprises a first electrode 620, a luminescent region 630, and a second electrode 640. Luminescent region 630 comprises a first charge transport zone 632, a light emitting zone 634, and a second charge transport zone 636. As shown in FIG. 6, second charge transport zone 636 comprises a light-absorbing layer 636A, and a charge transport layer 636B. The first electrode can be either a cathode or an anode, and the second electrode can be either a cathode or an anode. In addition, the first charge transport zone 632 can be either a hole transport zone (with the second charge transport zone being an electron transport zone) or an electron transport zone (with the second charge transport zone being a hole transport zone).

It will be appreciated that the light-absorbing layer can be located anywhere inside the luminescent region. For example, it can be located inside (and hence can be viewed as being part of) the electron transport zone or the hole transport zone (where the electron transport zone and the hole transport zone correspond to functional areas of the same layer, or two, three or more layers that comprise the luminescent region). The light-absorbing layer also can be located in between the electron transport zone and the light emitting zone, or in between the hole transport zone and the light emitting zone.

Figure 7:
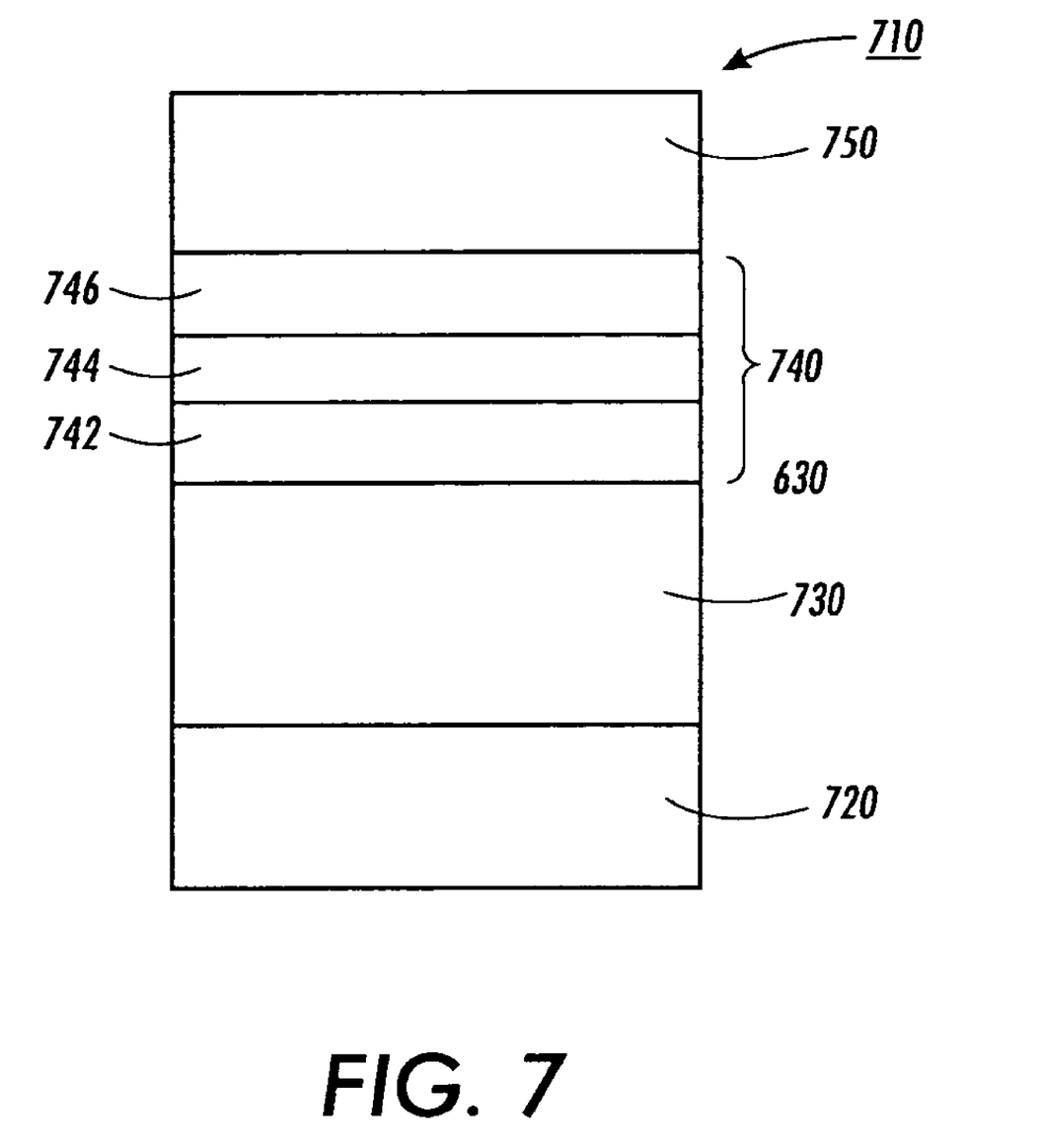
FIG. 7 is a schematic cross-sectional view of a display comprising a multi-layer light-absorbing layer.

With reference to FIG. 7, a display device comprising a multi-layer light-absorbing layer is shown. In FIG. 7, organic light emitting device 710 comprises a first electrode 720, a luminescent region 730, a light-absorbing layer 740, and a second electrode 750. The first electrode can be either a cathode or an anode, and the second electrode can be either a cathode or an anode. Light-absorbing layer or region 740 comprises three separate light-absorbing layers 742, 744, and 746. As used herein, adjacent light-absorbing layers are considered separate if the compositions of the adjacent layers differ from one another in terms of either the components of the light-absorbing layer or the concentrations or ratios of the components in the layers. That is, adjacent light-absorbing layers having the same components, i.e., the same metal nanoparticles and matrix material, will be considered separate layers if the components are present in the respective layers at different concentration levels. For purposes of the disclosure, adjacent light-absorbing layers having the exact same composition will be considered a single light-absorbing layer.

While not shown in the figures, it will be appreciated that a display device, such as the OLEDs of FIGS. 1-7, may include a substrate adjacent one of the first or second electrodes, i.e., adjacent one of the anode or the cathode. A substantially transparent substrate can comprise various suitable materials including, for example, polymeric components, glass, quartz and the like. Suitable polymeric components include, but are not limited to polyesters such as MYLAR®, polycarbonates, polyacrylates, polymethacrylates, polysulfones, and the like. Other substrate materials can also be selected provided, for example, that the materials can effectively support the other layers, and do not interfere with the device functional performance.

An opaque substrate can comprise various suitable materials including, for example, polymeric components like polyesters such as MYLAR®, polycarbonates, polyacrylates, polymethacrylates, polysulfones, and the like, which contain coloring agents or dyes such as carbon black. The substrate can also be comprised of silicon such as amorphous silicon, polycrystalline silicon, single crystal silicon, and the like. Another class of materials that can be used in the substrate are ceramics such as metallic compounds like metal oxides, metal halides, metal hydroxides, metal sulfides and others.

In embodiments, the substrate may have a thickness ranging for example from about 10 to about 5,000 micrometers. In other embodiments, the substrate may have a thickness of from about 25 to about 1,000 micrometers.

An anode can comprise suitable positive charge injecting materials such as indium tin oxide (ITO), silicon, tin oxide, and metals with a work function ranging from about 4 eV to about 6 eV such as gold, platinum, and palladium. Other suitable materials for the anode include, but are not limited to, electrically conductive carbon, $\pi$-conjugated polymers such as polyaniline, polythiophene, polypyrrole, and the like having, for example, a work function equal to, or greater than, about 4 eV, and, in embodiments, from about 4 eV to about 6 eV. A substantially transparent anode can comprise, for example, indium tin oxide (ITO), very thin substantially transparent metallic layers, comprising a metal with a work function ranging from about 4 eV to about 6 eV such as gold, palladium and the like, having a thickness, for example, from about 10 angstroms to about 200 angstroms, and, in embodiments, from about 30 angstroms to about 100 angstroms. Additional suitable forms of the anode are disclosed in U.S. Pat. Nos. 4,885,211 and 5,703,436, which are incorporated herein by reference in their entirety. An anode can also comprise a metal-organic mixed layer (MOML) as disclosed in copending U.S. patent application Ser. No. 10/117,812, which is incorporated herein by reference in its entirety. The thickness of the anode can range from about 10 angstroms to about 50,000 angstroms, with the desired range depending on the electrical and optical constants of the anode material. One illustrative range of anode thickness is from about 300 angstroms to about 3,000 angstroms. Of course, a thickness outside of this range can also be used.

A cathode can comprise suitable electron injecting materials, such as metals, including high work function components, such as metals with, for example, a work function from about 4 eV to about 6 eV, or low work function components, such as metals with, for example, a work function of from about 2 eV to about 4 eV. The cathode can comprise a combination of a low work function (less than about 4 eV) metal and at least one other metal. Effective proportions of the low work function metal to the second or other metal are from less than about 0.1 weight percent to about 99.9 weight percent. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are preferred low work function metals. Materials suitable for forming the cathode include, but are not limited to, the Mg—Ag alloy cathodes described in U.S. Pat. Nos. 4,885,211, 4,720,432, and 5,703,436, the disclosures of which are totally incorporated herein by reference. Other suitable cathodes comprise a metal-organic mixed later (MOML) as disclosed in U.S. patent application Ser. No. 10/117,812, which is incorporated herein by reference in its entirety, and in U.S. Pat. No. 5,429,884, the disclosure of which is totally incorporated herein by reference. The cathodes can be formed from lithium alloys with other high work function metals such as aluminum and indium.

A substantially transparent cathode can comprise very thin substantially transparent metallic layers comprising a metal with a work function ranging from about 2 eV to about 4 eV, such as Mg, Ag, Al, Ca, In, Li and their alloys such as Mg:Ag alloys, comprised of, for example, from about 80 to 95 volume percent of Mg and about 20 to about 5 volume percent of Ag, and Li:Al alloys, comprised of, for example, from about 90 to 99 volume percent of Al, and from about 10 to about 1 volume percent of Li, and the like, having a thickness, for example, from about 10 angstroms to about 200 angstroms, and, in embodiments, from about 30 angstroms to about 100 angstroms. Of course, a thickness outside of this range can also be used.

In embodiments, the cathodes may comprise one or more additional layers. The one or more additional layer(s) of the cathodes can comprise at least one metal and/or at least one inorganic material. Suitable exemplary metals that can be used in the additional layer(s) include, but are not limited to, Mg, Ag, Al, In, Ca, Sr, Au, Li, Cr and mixtures thereof. Suitable exemplary inorganic materials that can be used in the additional layer(s) include, but are not limited to, SiO, $SiO_2$, LiF, $MgF_2$ and mixtures thereof.

The one or more additional layer(s) can have the same or different functions from each other. For example, one or more additional layers of the cathode can comprise, or can consist essentially of, a metal to form a conductive layer with a low sheet resistance (e.g., <10 Ω/square). In addition, one or more additional layers of the cathode can protect the metal-organic mixed layer from the ambient by forming a passivating layer (such as, for example, a moisture barrier) that prevents, or at least reduces, the permeation of ambient moisture to the MOML, the luminescent region and the anode. Also, one or more additional layers of the cathode can act as a thermal protective layer to provide protection from device shorting at elevated temperatures. For example, such protection can be provided at temperatures ranging from about 60° C. to about 110° C., as discussed in more detail in U.S. patent application Ser. No. 09/770,154, filed Jan. 26, 2001, which is incorporated herein by reference in its entirety.

The thickness of the cathode can range from, for example, about 10 nanometers (nm) to about 1,000 nanometers. Thicknesses outside of this range can also be used.

The anode and cathode used in the present OLEDs each may be a single layer or may comprise two, three or more layers. For instance, the electrode may be composed of a charge injection layer (i.e., an electron injection layer or a hole injection layer) and a capping layer. In embodiments, however, the charge injection layer may be considered distinct from the electrode.

An electron injecting layer can include very thin substantially transparent metallic layers, composed of a metal with a work function ranging from about 2 eV to about 4 eV, such as Mg, Ag, Al, Ca, In, Li and their alloys such as Mg:Ag alloys composed of, for example, from about 80 to 95 volume percent of Mg and about 20 to about 5 volume percent of Ag, and Li:Al alloys, composed of, for example, from about 90 to 99 volume percent of Al, and from about 10 to about 1 volume percent of Li, and the like, having a thickness, for example, from about 10 angstroms to about 200 angstroms, and, in embodiments, from about 30 angstroms to about 100 angstroms. Of course, a thickness outside of these ranges can also be used. The electron injection layer can also include very thin insulative materials such as an oxide material or an alkaline metal compound as described in U.S. Pat. Nos. 5,457,565; 5,608,287 and 5,739,635, which are each incorporated herein by reference in their entirety.

A hole injecting layer can be composed of suitable positive charge injecting materials such as indium tin oxide (ITO), silicon, tin oxide, and metals with a work function ranging from about 4 eV to about 6 eV, such as, gold, platinum, and palladium. Other suitable materials for the hole injecting layer include, but are not limited to, electrically conductive carbon, π-conjugated polymers such as polyaniline, polythiophene, polypyrrole, and the like having, for example, a work function equal to, or greater than, about 4 eV, and particularly from about 4 eV to about 6 eV. A substantially transparent hole injecting material can be composed of very thin substantially transparent metallic layers, comprising a metal with a work function ranging from about 4 eV to about 6 eV, such as gold, palladium and the like, having a thickness, for example, from about 10 angstroms to about 200 angstroms, and, in some embodiments, from about 30 angstroms to about 100 angstroms. Of course, a thickness outside of these ranges can also be used. Additional suitable forms of hole injecting layers are disclosed in U.S. Pat. Nos. 4,885,211 and 5,703,436, which are incorporated herein by reference in their entirety.

A capping layer on the anode and/or cathode can be included in order to increase the thermal stability, increase the environmental stability, and/or in some other way improve the performance of the organic light emitting device. An example of a capping layer that can be used to increase the thermal stability of the organic light emitting is a layer comprised of SiO, $SiO_2$, or mixtures thereof. Other examples are disclosed in U.S. Pat. Nos. 6,765,348 and 6,614,175, the disclosures of which are totally incorporated herein by reference. An example of a capping layer that can be used to increase the environmental stability of the organic light emitting device is a layer comprised of a stable metal such as Ag, Al, In, or Au. Another example of a capping layer that can be used to increase the environmental stability of the organic light emitting device is a layer comprised of a low work function metal as described, for example, in U.S. Pat. No. 5,059,861. The thickness of the capping layer can, for example, range from about 20 nanometers to about 5,000 nanometers. In embodiments, the thickness is from about 50 nanometers to 500 nanometers.

A display device may optionally comprise a buffer layer between the anode and a hole transporting layer. A buffer layer primarily functions to achieve desirable charge injection of holes from the anode, and to improve adhesion between the anode and the hole transporting layer, thereby improving the device operation stability. Suitable materials that can be utilized in the buffer layer include semiconductive organic materials, such as, for example, porphyrin derivatives like 1,10,15,20-tetraphenyl-21H,23H-porphyrin copper (II) disclosed in U.S. Pat. No. 4,356,429, which is incorporated herein by reference in its entirety; copper phthalocyanine; copper tetramethyl phthalocyanine; zinc phthalocyanine; titanium oxide phthalocyanine; magnesium phthalocyanine; and the like. Mixtures of these and other suitable materials can also be used. Other suitable materials that can be utilized in the buffer layer include semiconductive and insulative metal compounds, such as for example metal oxides like MgO, $Al_2O_3$, BeO, BaO, AgO, SrO, SiO, $SiO_2$, $ZrO_2$, CaO, $Cs_2O$, $Rb_2O$, $Li_2O$, $K_2O$ and $Na_2O$; and metal halides, like LiF, KCl, NaCl, CsCl, CsF and KF. The buffer layer can have a thickness ranging from about 1 nm to about 100 nm. An illustrative thickness range for the buffer layer is from about 5 nm to about 25 nm. Another illustrative thickness range for the buffer layer is from about 1 nm to about 5 nm.

The luminescent region of the present display devices comprises, in embodiments, at least one electroluminescent organic material. The electroluminescent material is not critical and may be any material suitable for use as an electroluminescent material in a display device. Suitable organic electroluminescent materials include, for example, polyphenylenevinylenes, such as poly(p-phenylenevinylene) PPV, poly(2-methoxy-5-(2-ethylhexyloxy) 1,4-phenylenevinylene) (MEHPPV) and poly(2,5-dialkoxyphenylenevinylene) (PDMeOPV), and other materials disclosed in U.S. Pat. No. 5,247,190, which is incorporated herein by reference in its entirety; polyphenylenes, such as poly(p-phenylene) (PPP), ladder-poly-para-phenylene (LPPP), and poly(tetrahydropyrene) (PTHP); and polyfluorenes, such as poly(9, 9-di-n-octylfluorene-2,7-diyl), poly(2,8-(6,7,12,12-tetraalkylindenofluorene) and copolymers containing fluorenes such as fluorene-amine copolymers (see e.g., Bernius et al., "Developmental Progress of Electroluminescent Polymeric Materials and Devices," Proceedings of SPIE Conference on Organic Light Emitting Materials and Devices III, Denver, Colo., July 1999, Volume 3797, p. 129).

Another class of organic electroluminescent materials that can be utilized in the luminescent region includes, but is not limited to, the metal oxinoid compounds as disclosed in U.S. Pat. Nos. 4,539,507; 5,151,629; 5,150,006; 5,141,671 and 5,846,666, each incorporated herein by reference in its entirety. Illustrative examples include tris(8-hydroxyquinolinate)aluminum (AIQ3), and bis(8-hydroxyquinolato)-(4-phenylphenolato)aluminum (BAlq). Other examples of this class of materials include tris(8-hydroxyquinolinate)gallium, bis(8-hydroxyquinolinate)magnesium, bis(8-hydroxyquinolinate)zinc, tris(5-methyl-8-hydroxyquinolinate)aluminum, tris(7-propyl-8-quinolinolato)aluminum, bis[benzo{f}8-quinolinate]zinc, bis(10-hydroxybenzo[h]quinolinate)beryllium, and the like, and metal thioxinoid compounds disclosed in U.S. Pat. No. 5,846,666 (which is incorporated herein by reference in its entirety), such as metal thioxinoid compounds of bis(8-quinolinethiolato)zinc, bis(8-quinolinethiolato)cadmium, tris(8-quinolinethiolato)gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like.

More specifically, a class of organic electroluminescent materials that can be used in the luminescent region comprises stilbene derivatives, such as those disclosed in U.S. Pat. No. 5,516,577, incorporated herein by reference in it entirety. A non-limiting example of a suitable stilbene derivative is 4,4'-bis(2,2-diphenylvinyl)biphenyl.

A class of bipolar transport materials that can be used in a mixed region comprises anthracenes, such as, for example 2-t-butyl-9,10-di-(2-naphthyl)anthracene, 9,10-di-(2-naphthyl)anthracene, 9,10-di-phenyl anthracene, 9,9-bis[4-(9-anthryl)phenyl]fluorine, and 9,9-bis[4-(10-phenyl-9-anthryl) phenyl]fluorine. Other suitable anthracenes are disclosed in U.S. application Ser. No. 09/208,172 (corresponding to EP 1009044 A2), now U.S. Pat. No. 6,465,115, those disclosed in U.S. Pat. No. 5,972,247, and those disclosed in U.S. Pat. No. 5,935,721, and U.S. application Ser. No. 09/771,311, now U.S. Pat. No. 6,479,172, the disclosures of which are totally incorporated herein by reference.

Another class of suitable organic electroluminescent materials suitable for use in the luminescent region is the oxadiazole metal chelates disclosed in U.S. patent application Ser. No. 08/829,398, which is incorporated herein by reference in its entirety. These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato] beryllium; bis[5-biphenyl-2-(2-hydroxyphenyl)-1,3,4-oxadiazolato]zinc; bis[5-biphenyl-2-(2-hydroxyphenyl)-1,3, 4-oxadiazolato]beryllium; bis[2-(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis [5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato] zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato] zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-u,-(2-hydroxynaphthyl)-5-phenyl-1,3,4-oxadiazolato]-zinc; bis[2-(2-hydroxyphenyl)-5-p-pyridyl-1,3,4-oxadiazolato]zinc; bis [2-(2-hydroxyphenyl)-5-p-pyridyl-1,3,4-oxadiazolato] beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato] beryllium, and the like; and the triazines including those disclosed in U.S. patent application Ser. No. 09/489,144, filed on Jan. 21, 2000 and U.S. Pat. No. 6,057,048, each incorporated herein in its entirety. The luminescent region can further include from about 0.01 weight percent to about 25 weight percent of a luminescent material as a dopant. Examples of dopant materials that can be utilized in the luminescent region are fluorescent materials, such as, for example, coumarin, dicyanomethylene pyranes, polymethine, oxabenzanthrane, xanthene, pyrylium, carbostyl, perylene, and the like. Another suitable class of fluorescent materials are quinacridone dyes. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, and the like as disclosed in U.S. Pat. Nos. 5,227,252; 5,276,381; and 5,593,788, each incorporated herein in its entirety. Another class of fluorescent materials that may be used is fused ring fluorescent dyes. Exemplary suitable fused ring fluorescent dyes include perylene, rubrene, anthracene, coronene, phenanthrecene, pyrene and the like, as disclosed in U.S. Pat. No. 3,172,862, which is incorporated herein by reference in its entirety. Also, fluorescent materials include butadienes, such as 1,4-diphenylbutadiene and tetraphenylbutadiene, and stilbenes, and the like, as disclosed in U.S. Pat. Nos. 4,356,429 and 5,516,577, each incorporated herein by reference in its entirety. Other examples of fluorescent materials that can be used are those disclosed in U.S. Pat. No. 5,601,903, which is incorporated herein by reference in its entirety.

Additionally, luminescent dopants that can be utilized in the light luminescent region are the fluorescent dyes disclosed in U.S. Pat. No. 5,935,720 (which is incorporated herein by reference in its entirety), such as, for example, 4-(dicyanomethylene)-2-1-propyl-6-(1,1,7,7-tetramethyljulolidyl-9-enyl)-4H-pyran (DCJTB); the lanthanide metal chelate complexes, such as for example, tris(acetyl acetonato) (phenanthroline) terbium, tris(acetyl acetonato)(phenanthroline) europium, and tris(thenoyl trisfluoroacetonato)(phenanthroline) europium, and those disclosed in Kido et al., "White light emitting organic electroluminescent device using lanthanide complexes," Jpn. J. Appl. Phys., Volume 35, pp. L394-L396 (1996), which is incorporated herein by reference in its entirety; and phosphorescent materials, such as, for example, organometallic compounds containing heavy metal atoms that lead to strong spin-orbit coupling, such as those disclosed in Baldo et. al.; "Highly efficient organic phosphorescent emission from organic electroluminescent devices," Letters to Nature, Volume 395, pp. 151-154 (1998), which is incorporated herein by reference in its entirety. Preferred examples include 2,3,7,8,12,13,17,18-octaethyl-21H23H-phorpine platinum(II) (PtOEP) and fac tris(2-phenylpyridine)iridium (Ir(ppy)3).

The luminescent region can also include one or more materials with hole-transporting properties. Examples of hole-transporting materials that can be utilized in the luminescent region include polypyrrole, polyaniline, poly(phenylene vinylene), polythiophene, polyarylamine as disclosed in U.S. Pat. No. 5,728,801, which is incorporated herein by reference in its entirety, and their derivatives, and known semiconductive organic materials; porphyrin derivatives such as 1,10,15,20-tetraphenyl-21H,23H-porphyrin copper (II) disclosed in U.S. Pat. No. 4,356,429, incorporated herein by reference in its entirety; copper phthalocyanine; copper tetramethyl phthalocyanine; zinc phthalocyanine; titanium oxide phthalocyanine; magnesium phthalocyanine; and the like.

A specific class of hole transporting materials that can be utilized in the luminescent region are the aromatic tertiary amines such as those disclosed in U.S. Pat. No. 4,539,507, which is incorporated herein by reference in its entirety. Suitable exemplary aromatic tertiary amines include, but are not limited to, bis(4-dimethylamino-2-methylphenyl)phenylmethane; N,N,N-tri(p-tolyl)amine; 1,1-bis(4-di-p-tolylaminophenyl)cyclohexane; 1,1-bis(4-di-p-tolylaminophenyl)-4-phenyl cyclohexane; N,N'-diphenyl-N,N'-bis(3-methylphenyl)-1,1'-biphenyl-4,4'-diamine; N,N'-diphenyl-N,N'-bis(3-methylphenyl)-1,1'-biphenyl-4,4'-diamine; N,N'-diphenyl-N,N'-bis(4-methoxyphenyl)-1,1'-biphenyl-4,4'-diamine; N,N,N',N'-tetra-p-tolyl-1,1'-biphenyl-4,4'-diamine; N,N'-di-1-naphthyl-N,N'-diphenyl-1,1'-biphenyl-4,4'-diamine; N,N'-di(naphthalene-1-yl)-N,N'-diphenyl-benzidine ("NPB"); mixtures thereof and the like. Another class of aromatic tertiary amines are polynuclear aromatic amines. Examples of these polynuclear aromatic amines include, but are not limited to, N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenyl-amino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like; 4,4'-bis(9-carbazolyl)-1,1'-biphenyl compounds, such as, for example 4,4'-bis(9-carbazolyl)-1,1'-biphenyl and 4,4'-bis(3-methyl-9-carbazolyl)-1,1'-biphenyl, and the like.

A specific class of the hole transporting materials that can be used in the luminescent region are the indolo-carabazoles, such as those disclosed in U.S. Pat. Nos. 5,942,340 and 5,952,115, each incorporated herein by reference in its entirety, such as, for example, 5,11-di-naphthyl-5,11-dihydroindolo[3,2-b]carbazole, and 2,8-dimethyl-5,11-di-naphthyl-5,11-dihydroindolo[3,2-b]carbazole; N,N,N'N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N'N'-tetraarylbenzidine are N,N,-di-1-naphthyl-N,N'-diphenyl-1,1'-biphenyl-4,4'-diamine; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like. Suitable hole transporting materials that can be used in the luminescent region are the naphtyl-substituted benzidine derivatives.

The luminescent region can also include one or more materials with electron transporting properties. An example of electron transporting materials that can be utilized in the luminescent region is polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers, as disclosed in incorporated Bernius et al., Proceedings of SPIE Conference on Organic Light Emitting Materials and Devices III, Denver, Colo., July 1999, Volume 3797, p. 129.

Other examples of electron transporting materials that can be utilized in the luminescent region can be selected from the metal oxinoid compounds, the oxadiazole metal chelate compounds, the triazine compounds and the stilbene compounds, examples of which have been described above in detail.

In embodiments where the luminescent region includes one or more hole transport material and/or one or more electron transport material in addition to the organic electroluminescent material(s), the organic electroluminescent material, the hole transport material(s), and/or the electron transport material(s) can be formed in separate layers, such as, for example, the OLEDs disclosed in U.S. Pat. Nos. 4,539,507; 4,720,432 and 4,769,292; or in the same layer thus forming mixed zones of two or more materials, such as, for example, the OLEDs disclosed in U.S. Pat. Nos. 6,130,001; 6,392,339; 6,392,250, and 6,614,175. The disclosures of these patents and patent applications are incorporated herein by reference in their entirety.

The thickness of the luminescent region can vary from, for example, about 1 nm to about 1000 nm. In embodiments, the thickness of the luminescent region is from about 20 nm to about 200 nm, and, in other embodiments, from about 50 nm to about 150 nm.

A light-absorbing layer in accordance with the present disclosure comprises metal nanoparticles and a matrix material. The metal nanoparticles may be dispersed in, completely embedded in, or partially embedded in the matrix material. The matrix material may be selected from materials including polymeric materials, inorganic materials, and organic materials.

The metal nanoparticles may comprise any metal that would impart light-absorbing properties to the light-absorbing layer. Suitable metals include, but are not limited to, those metals characterized by a plasma frequency in the range of 400-700 nm such as, for example, Ag, Au, Pt, Pd, Ni, and Cu, and alloys thereof. Other metals that are known to form nanoparticles that have light-absorbing properties include Se, Te, As, Zn, Sn, Ga, Co, and alloys thereof. In embodiments, the metal nanoparticles comprise a metal selected from the group consisting of Ag, Au, Cu, Se, Te, As, Zn, Ga, Co, Pt, Pd, Ni, In, Ti, and combinations thereof. In other embodiments, the metal nanoparticles are selected from Ag, Au, Cu, Se, Te, As, Zn, Sn, Ga, Co, Pt, Pd, Ni, In, Ti, alloys of Ag, Au, Cu, Se, Te, As, Zn, Sn, Ga, Co, Pt, Pd, Ni, In, Ti, and combinations thereof.

The metal nanoparticles may have various morphologies or structures. For example, the metal nanoparticles may have regular shapes, irregular shapes, two-dimensional structures, and/or three-dimensional structures. Non-limiting examples of suitable regular shapes of the metal nanoparticles include spheres, oblate spheres, prolate spheroids, ellipsoids, rods, cylinders, cones, disks, cubes, and rectangles. In a given light-absorbing layer, the metal nanoparticles may have the same or different shapes. A given light-absorbing layer may comprise metal nanoparticles of the same metal or different metals, of the same or different shapes and/or of the same or different sizes. Additionally, a given light-absorbing layer may include individual particles (of the same or different metals and/or shapes and sizes) and particles that are formed into a two-dimensional or three-dimensional structure.

The particle size of the metal nanoparticles is in the range of from about 1 to about 30 nm. As used herein, the particle size of a metal nanoparticle refers to the size of one or more characteristic dimensions of a given nanoparticle. The one or more characteristic dimensions of a metal nanoparticle upon which the size of the metal nanoparticle is based depends upon the shape of the nanoparticle. For example, non-limiting examples of the characteristic dimension of a metal nanoparticle include, but are not limited to, the diameter with respect to spherical, spheroid shaped, or ellipsoid shaped particles; the length of one or more sides of the particle with respect to cubed or rectangular shaped nanoparticles; and the length and/or diameter of the particles with respect to rod shaped, cylinder shaped, cone shaped or disk shaped particles. In one embodiment, the metal nanoparticles have a particle size of from about 1 to about 15 nm. In another embodiment, the metal nanoparticles have a particle size of from about 15 to about 30 nm. In another embodiment, the metal nanoparticles have a particle size of from about 10 to about 20 nm. In still another embodiment, the metal nanoparticles have a particle size of about 10 nm.

In embodiments, there is a narrow variance in the particle size of a population of metal nanoparticles in a light-absorbing layer in accordance with the present disclosure. Without being bound to any particular theory, a small or narrow variance in particle size enhances the light absorption effect of the metal nanoparticles. Variance in particle size is referred to herein as particle size distribution. Particle size distribution is defined herein as the percent difference between the particle size of any given metal nanoparticle in a population of metal nanoparticles and the average particle size of the population of metal nanoparticles. In one embodiment, the average particle size of the population of metal nanoparticles in the light-absorbing layer is from about 2 to about 20 nm. In another embodiment, the average particle size of the population of metal nanoparticles in the light-absorbing layer is from about 5 to about 15 nm. In yet another embodiment, the average particle size of the population of metal nanoparticles in the light-absorbing layer is about 10 nm. In one embodiment, the particle size distribution of the metal nanoparticles in a light-absorbing layer does not exceed +/−75%. In another embodiment, the particle size distribution does not exceed +/−50%. In yet another embodiment, the particle size distribution does not exceed +/−25%.

In one embodiment, the average particle size of the population of metal nanoparticles in the light-absorbing layer is from about 2 to about 20 nm. and the particle size distribution is not exceeding +/−75%. In another embodiment, the average particle size of the population of metal nanoparticles in the light-absorbing layer is from about 5 to about 15 nm and the particle size distribution is not exceeding +/−50%. In another embodiment, the average particle size of the population of metal nanoparticles in the light-absorbing layer is from about 5 to about 15 nm and the particle size distribution is not exceeding +/−25%. In yet another embodiment, the average particle size of the population of metal nanoparticles in the light-absorbing layer is about 10 nm and the particle size distribution is not exceeding +/−50%. In another embodiment, the average particle size of the population of metal nanoparticles in the light-absorbing layer is about 10 nm and the particle size distribution is not exceeding +/−25%.

The matrix material may be selected from the group consisting of inorganic materials, polymeric materials, and organic materials.

The inorganic matrix material is, in embodiments, a metal containing compound. Metal containing compounds suitable as the inorganic matrix material include, but are not limited to oxides, hydroxides, halides, borides, nitrides, sulphides, and carbides of a metal, and the like. Suitable metal components of the inorganic material include, but are not limited to, a metal selected from Groups I, II, and IIIB of the periodic table, a transition metal, and the like. Additionally, the inorganic material may comprise an elemental species selected from Groups IIIA, IVA, or VA of the periodic table, or combinations thereof. Examples of metals suitable as part of the inorganic matrix material include, but are not limited to Li, Na, K, Rb, Cs, Be, Mg, Ca, Sr, Ba, Sc, Y, La, Ti, Zr, Hf, V, Nb, Ta, Cr, Mo, W, Nm, Tc, Fe, Ru, Os, Co, Rh, Ir, Ni, Pd, Pt, Cu, Ag, Au, Zn, Cd, B, Al, Ga, In, Sn, Pb, Sb, Bi, Se, Te, Ce, Nd, Sm, and Eu. The inorganic matrix material may be a compound based on Groups III-V such as, for example, GaAs or InP, or a compound based on Groups II-VI such as, for example, ZnS. Specific examples of materials suitable as an inorganic matrix material include, but are not limited to, LiF, LiCl, LiBr, LiI, NaF, Na Cl, NaBr, NaI, KF, KCl, KBr, KI, RbF, RbCl, CsF, CsCl, $MgF_2$, $SrF_2$, $AlF_3$, AgCl, AgF, $CuCl_2$, $Li_2O$, $SnO_2$, SiO, $SiO_2$, $In_2O_3$, ITO, $TiO_2$, $Al_2O_3$, AgO, $CaF_2$, $CaB_6$, ZnO, $CsO_2$, ZnO, $Cu_2O$, CuO, $Ag_2o$, NiO, TiO, $Y_2o_3$, $ZrO_2$, $Cr_2O_3$, LaN, YN, GaN, C, $Li_2C$, FeC, NiC, Ge, Si, SiC, SiO, $SiO_2$, $Si_3N_4$, ZnTe, ZnSe, and the like. Other examples of a material suitable in a light-absorbing layer include those Se and SeTe compositions disclosed in U.S. Pat. Nos. 3,598,644 and 4,084,966, the entire disclosures of which are incorporated herein by reference.

The inorganic matrix material may be conductive, semi-conductive, or non-conductive. In one embodiment where the light-absorbing layer is located in one of the anode, cathode, or luminescent region, the inorganic matrix material is conductive or semiconductive.

The matrix material may also be selected from a polymeric material. Examples of suitable polymeric matrix materials include, but are not limited to, polycarbonate, polymethylmethacrylate, polyfluorene, polyvinyl carbazole, polyparaphenylenevinylene, polystyrene, and the like. Other examples of polymeric materials suitable as the matrix material in a light-absorbing layer in accordance with the present disclosure include those polymeric materials disclosed as a softenable material for use in a migration imaging system in U.S. Pat. Nos. 3,598,644 and 4,084,966, the entire disclosures of which are incorporated herein by reference. Such other suitable polymeric materials include, for example, hydrogenated or partially hydrogenated rosin esters, substituted polystyrenes, styrene acrylate polymers, polyolefins, polyesters silicones including, for example, methyl, phenyl silicones, polystyrene-olefin copolymers, and epoxy resins. Examples of suitable styrene acrylate polymers include but are not limited to, copolymers of styrene and an acrylate such as, for example, octyl acrylate, docosylacrylate, methyl methacrylate, ethyl methacrylate, butyl methacrylate, hexyl methacrylate and the like.

Suitable organic materials for the light-absorbing layer can be, for example, organic materials including electroluminescent materials, hole transport materials and electron transport materials utilized in fabricating the luminescent region of the display device, such electroluminescent materials being described herein. For example, suitable organic materials for the light-absorbing layer include, but are not limited to, molecular (small-molecule) organic compounds such as metal oxinoids, metal chelates, tertiary aromatic amines, indolocarbozoles, porphyrins, phthalocyanines, triazines, anthracenes, and oxadiazoles. Organic materials also suitable as the matrix material include those materials described in U.S. patent application Ser. Nos. 10/117,812 and 10/401,238, which are published as U.S. Patent Publication Nos. 2002/0180349 and 2003/0234609, respectively, the entire disclosures of which are incorporated herein by reference. A non-limiting example of a suitable organic matrix material includes tris(8-hydroxyquinolate)aluminum (AlQ3).

In embodiments, the metal nanoparticles are present in a light-absorbing layer in an amount of from about 5 to about 50 vol. % and the matrix material is present in an amount of from about 95 to about 50 vol. % of the light-absorbing layer. In other embodiments, the metal nanoparticles are present in a light-absorbing layer in an amount of from about 10 to about 30 vol. % and the matrix material is present in an amount of about 90 to about 70 vol. % of the light-absorbing layer. In still other embodiments, the metal nanoparticles are present in an amount of about 50 vol. % and the matrix material is present in an amount of about 50 vol. % of the light-absorbing layer.

The light-absorbing layer may be either a single layer configuration or a multi-layer configuration. A multi-layer light-absorbing layer may comprise 2, 3, 4, 5, or more light-absorbing layers immediately adjacent one another, i.e., in a stacked configuration, or separated by one or more additional layers. A multi-layer light-absorbing layer is also referred to herein as a light-absorbing region or zone.

In embodiments having a light-absorbing layer comprised of multiple light-absorbing layers, layers immediately adjacent one another generally comprise different compositions in terms of at least one of the matrix material and/or concentration of the matrix material. For example, in embodiments, adjacent light-absorbing layers may comprise the same matrix material and the same type of metal (nanoparticle) but at different concentrations. In other embodiments, adjacent light-absorbing layers may comprise different matrix material compositions from the same class of materials (i.e., inorganic materials, polymeric materials, or organic materials). In still other embodiments, adjacent light-absorbing layers may each comprise a different matrix material composition from different classes of matrix materials. For example, one light-absorbing layer may comprise an inorganic matrix material and a second light-absorbing layer adjacent the first light-absorbing layer may comprise a polymeric or organic matrix material. For purposes of this disclosure, adjacent light-absorbing layers having identical compositions with respect to both the type of matrix material and metal and concentrations thereof will be considered a single light-absorbing layer. In embodiments wherein a light-absorbing layer has a multi-layer configuration comprising two or more light-absorbing layers separated by another layer, the non-adjacent light-absorbing layers may have identical compositions. In other embodiments wherein a light-absorbing layer has a multi-layer configuration with a plurality of light-absorbing layers in a stacked configuration, non-adjacent light-absorbing layers may have identical compositions.

The thickness of the light-absorbing layer or layers may be varied as desired for a particular application. In embodiments, a light-absorbing layer has a thickness of from about 10 nm to about 1000 nm.

In other embodiments, a light-absorbing layer in accordance with the present disclosure may have a thin-layer configuration as described in co-pending U.S. patent application Ser. No. 11/133,752 [20041458-US-NP], which is filed concurrently (on the same day) herewith, and the entire disclosure of which is incorporated herein by reference. Specifically, a light-absorbing layer comprising metal nanoparticles may be of a thin-layer configuration having a thickness of, in one embodiment, from about 10 to about 100 nm, and, in another embodiment, from about 30 to about 50 nm. In embodiments, a thin-layer light-absorbing layer or region may have a multi-layer configuration comprising 2, 3, 4, 5, or more light-absorbing layers. In thin-layer multi-layer configurations, each individual layer of the light-absorbing layer may have a thickness of from about 5 to about 95 nm. In one embodiment, a thin-layer light-absorbing layer has a thickness of from about 10 to about 100 nm. In another embodiment, a thin-layer light-absorbing layer has a thickness of from about 30 to about 50 nm. As previously described herein, a light-absorbing layer may comprise 2, 3, 4, 5, or more individual light-absorbing layers. In other embodiments, the light-absorbing layer has a thickness of from about 100 nm to about 300 nm.

The light-absorbing properties of a light-absorbing layer may be defined in terms of the optical density (O.D.) of the light-absorbing layer. In embodiments, the optical density a light-absorbing layer is at least 0.1 for at least a part of the visible range of the electromagnetic spectrum (i.e., 400 to 700 nm). In other embodiments, the optical density of a light-absorbing layer is from about 0.5 to about 2.5.

Any suitable technique may be employed to form a light-absorbing layer and display device in accordance with the present disclosure. Suitable techniques include, but are not limited to, physical thermal vapor deposition (PVD), spin-coating, sputtering, electron beam, electron arc, chemical vapor deposition (CVD), liquid deposition, and the like. In PVD, for example, a light-absorbing layer is formed by co-evaporating the metal and matrix material from heated sources in a vacuum and condensing/depositing the vapor on the desired substrate/surface through a mask. The evaporation rate of the individual materials is controlled in order to obtain the desired metal particle size and the desired ratio of the metal and matrix components. Light-absorbing layers comprising a polymeric matrix material may be formed by forming a dispersion of the metal and polymer solution and then applying the dispersion to the substrate/device by any suitable coating technique including, for example, spin-coating, blade-coating, dip-coating, ink-jet printing, and the like. A light-absorbing layer comprising metal nanoparticles in a polymeric matrix may also be formed by thermal vapor deposition of the metal nanoparticles on a polymeric surface, as described in U.S. Pat. No. 3,598,644.

In embodiments, one or more layers of a display device are formed by liquid deposition or solution processes. In one embodiment, at least the light-absorbing layer is formed from a liquid deposition or solution process. It will be appreciated that either one or both of the matrix material or metal nanoparticle components of the light-absorbing layer may be formed from a liquid deposition or solution process. Examples of suitable liquid deposition processes include, but are not limited to, spin-coating, inkjet printing, blade coating, web coating, and dip coating.

Light-absorbing layers as described herein are suitable for use in a display device to reduce the reflection of ambient light in the device. Reflection reduction may be quantified in terms of, for example, a Sun/Eye-Integrated Reflectance Percentage (SEIR %). SEIR is the total percent fraction of incident light that gets reflected off the display device, e.g., OLED, front integrated over the entire visible range of the visible spectrum (in the range of 400-700 nm for incident light) and weighted to the human eye sensitivity over that range. In embodiments, a display device employing a light-absorbing layer in accordance with the present disclosure may have a percent reflection of less than about 50%. In other embodiments, the percent reflection may be less than about 20%. In still other embodiments, the percent reflection may be less than about 10%.

While the use of light-absorbing layers in accordance with the present disclosure have been described with reference to OLEDs, it will be appreciated that such light-absorbing layers may be applied to any kind of OLED or other display devices. For example, a light-absorbing layer in accordance with the present disclosure may be suitable for use in molecular (small-molecule)-based OLEDs, dendrimer-based OLEDs, polymer-based OLEDs, hybrid OLEDs comprising both molecular and polymeric materials in the light-emitting region, hybrid OLEDs comprising both organic and inorganic materials in the light-emitting region, inorganic electroluminescent or phosphor devices, liquid crystal displays (LCDs), plasma displays, and the like.

Display devices comprising a light-absorbing layer according to the present disclosure are further described and understood with reference to the following examples. The examples are for purpose of illustration only and are not intended to be limiting in any manner.

EXAMPLES

Examples 1-4 in Table 1 below summarize OLED devices comprising a light-absorbing layer comprising metal nanoparticles in an inorganic matrix that have been reduced to practice. Example 1 is a control device that does not contain a light-absorbing layer. All devices were fabricated using physical vapor deposition in vacuum ($5 \times 10^{-6}$ Torr) on ITO-coated glass substrates that were pre-cleaned using UV-ozone cleaning. The numbers in parentheses refer to layer thickness in angstroms (Å).

TABLE 1

| Example # | Anode | Luminescent Zone | | | Cathode | Metal nanoparticle layer | L (cd/m2), V (volts) at 25 mA/cm2 | Emission Color | % Reflection | Remarks |
| --- | --- | --- | --- | --- | --- | --- | --- | --- | --- | --- |
| | | Hole Transport Zone | Light Emitting Zone | Electron Transport Zone | | | | | | |
| 1 | ITO | NPB (600) | AlQ3 | (750) | Ca(20)/Ag(1200) | — | 665, 7.85 | Green | 74 | No light-absorbing layer (prior art) |
| 2 | ITO | NPB (600) | AlQ3 | (750) | Ca(20)/metal nanoparticle light absorption layer (450)/Ag(1200) | LiF + Ag (50:50 by volume) | 141, 11.9 | Green | 13 | |
| 3 | ITO | NPB (600) | AlQ3 | (750) | Ca(20)/metal nanoparticle light absorption layer (450)/Ag(1200) | LiF + Ag (25:75 by volume) | 300, 11.6 | Green | 48 | |
| 4 | ITO | NPB (600) | AlQ3 | (750) | Ca(20)/metal nanoparticle light absorption layer (900)/Ag(1200) | LiF + Ag (50:50 by volume) | 265, 10.7 | Green | 35 | |

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications, variations, improvements, and substantial equivalents.

The invention claimed is:

1. A display device comprising:
    a cathode;
    an anode;
    a luminescent region disposed between the cathode and said anode; and
    a light-absorbing layer comprising i) metal nanoparticles, and ii) an inorganic matrix material, wherein the average particle size of the population of metal nanoparticles in the light-absorbing layer is from about 2 to about 20 nm and the metal nanoparticles have a particle size distribution not exceeding +/−75%;

wherein said light-absorbing layer has a thickness of from about 10 to about 1000 nm, and wherein said metal nanoparticles are present in an amount of about 5 to about 50 percent by volume of said light-absorbing layer, and said matrix material is present in an amount of about 95 to about 50 percent by volume of the light-absorbing layer;

wherein said metal nanoparticles are completely embedded in, or partially embedded in the matrix material.

2. The display device of claim 1, wherein said metal nanoparticles have a particle size distribution not exceeding ±50%.

3. The display device of claim 1, wherein said metal nanoparticles have a particle size distribution not exceeding ±25%.

4. The display device of claim 1, wherein the average particle size of the population of metal nanoparticles in the light-absorbing layer is from about 5 to about 15 nm.

5. The display device of claim 1, wherein the average particle size of the population of metal nanoparticles in the light-absorbing layer is about 10 nm.

6. The display device of claim 1, wherein said metal nanoparticles have a shape selected from the group consisting of regular shapes, irregular shapes, two-dimensional structures, three-dimensional structures, and combinations thereof.

7. The display device of claim 1, wherein said metal nanoparticles have a shape selected from the group consisting of spheres, oblate spheres, prolate spheroids, ellipsoids, rods, cylinders, cones, disks, cubes, rectangles, and combinations thereof.

8. The display device of claim 1, wherein said cathode comprises said light-absorbing layer.

9. The display device of claim 1, wherein said light-absorbing layer is located outside of one of said anode, and cathode.

10. The display device of claim 1, wherein said light-absorbing layer is located within said luminescent region.

11. The display device of claim 1, wherein said light-absorbing layer is located within said anode.

12. The display device of claim 1, wherein said metal nanoparticles are selected from the group consisting of Ag, Au, Cu, Se, Te, As, Zn, Sn, Ga, Co, Pt, Pd, Ni, In, Ti, alloys thereof, and combinations of metals and alloys thereof.

13. The display device of claim 1, wherein the device is an organic light emitting device.

14. The display device of claim 1, wherein the inorganic matrix material conductive or semiconductive.

15. A display device comprising:
an optional substrate;
a first electrode;
a second electrode;
a luminescent region disposed between said first and second electrodes; and
a light-absorbing layer comprising:
metal nanoparticles, and
an inorganic matrix material, wherein said metal nanoparticles have an average particle size of from about 2 to about 20 nm and a particle size distribution not exceeding ±75%;

wherein said light-absorbing layer has a thickness of from about 10 to about 1000 nm, and wherein said metal nanoparticles are present in an amount of about 5 to about 50 percent by volume of said light-absorbing layer, and said matrix material is present in an amount of about 95 to about 50 percent by volume of the light-absorbing layer;

wherein said metal nanoparticles are completely embedded in, or partially embedded in the matrix material.

16. The display device of claim 15, wherein said metal nanoparticles have an average particle size of from about 5 to about 15 nm.

17. The display device of claim 15, wherein said metal nanoparticles have a particle size distribution not exceeding ±50%.

18. The display device of claim 15, wherein said metal nanoparticles have an average particle size of about 10 nm.

19. The display device of claim 15, wherein said metal nanoparticles have a particle size distribution not exceeding ±25%.

20. The display device of claim 15, wherein said inorganic material comprises a component selected from the group consisting of metal selected from a metal of groups I, II, and III, an elemental species selected from groups IIIA, IVA, and VA, a transition metal, and combinations thereof.

21. The display device of claim 15, wherein said inorganic material is selected from the group consisting of ZnTe, ZnSe, and combinations thereof.

22. The display device of claim 15, wherein said light-absorbing layer has a thickness of about 10 to about 100 nm.

23. The display device of claim 15, wherein said light-absorbing layer comprises a plurality of layers.

24. The display device of claim 23, wherein said light-absorbing layer has a thickness of about 10 to about 100 nm.

25. The display device of claim 15, wherein said first electrode is a cathode, said cathode comprising said light-absorbing layer.

26. The display device of claim 15, wherein said light-absorbing layer is located in one of said first or second electrodes.

27. The display device of claim 15, wherein said light-absorbing layer is located in said luminescent region.

28. The display device of claim 15, wherein said light-absorbing layer is located outside one of said first and second electrodes.

29. The display device of claim 15, wherein said metal nanoparticles are selected from the group consisting of Ag, Au, Cu, Se, Te, As, Sn, S, Ga, Co, Pt, Pd, Ni, In, Ti, alloys of Ag, Au, Cu, Se, Te, As, Zn, Se, Ga, Co, Pt, Pd, Ni, In, Ti, and combinations thereof.

30. The display device of claim 1, wherein the light-absorbing layer comprises a plurality of layers each having a different concentration of the metal nanoparticles.

31. The display device of claim 15, wherein the light-absorbing layer comprises a plurality of layers each having a different concentration of the metal nanoparticles.

32. The display device of claim 15, wherein the inorganic matrix material conductive or semiconductive.

* * * * *